United States Patent
Park et al.

(10) Patent No.: US 12,419,059 B2
(45) Date of Patent: Sep. 16, 2025

(54) SELF-SELECTING MEMORY DEVICES

(71) Applicant: SAMSUNG ELECTRONICS CO., LTD., Suwon-si (KR)

(72) Inventors: Doyoun Park, Suwon-si (KR); Seulji Song, Suwon-si (KR); Yoonjong Song, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 402 days.

(21) Appl. No.: 18/108,117

(22) Filed: Feb. 10, 2023

(65) Prior Publication Data

US 2023/0389337 A1 Nov. 30, 2023

(30) Foreign Application Priority Data

May 25, 2022 (KR) .......................... 10-2022-0064060

(51) Int. Cl.
*H10B 63/00* (2023.01)
(52) U.S. Cl.
CPC ............. *H10B 63/24* (2023.02); *H10B 63/84* (2023.02)
(58) Field of Classification Search
CPC ...... H10B 63/24; H10B 63/84; H10N 70/063; H10N 70/20; H10N 70/8825; H10N 70/826; H10N 70/883
See application file for complete search history.

(56) References Cited

U.S. PATENT DOCUMENTS

| | | | |
|---|---|---|---|
| 10,283,707 B2 | 5/2019 | Kamata | |
| 10,347,831 B2 | 7/2019 | Gealy et al. | |
| 10,424,730 B2 | 9/2019 | Pirovano et al. | |
| 10,475,995 B2 | 11/2019 | Fantini | |
| 10,541,364 B2 | 1/2020 | Pirovano et al. | |
| 10,600,844 B2* | 3/2020 | Conti | H10N 70/011 |
| 10,693,065 B2 | 6/2020 | Redaelli et al. | |
| 10,825,863 B2* | 11/2020 | Redaelli | H10B 63/84 |
| 10,854,813 B2 | 12/2020 | Tortorelli et al. | |
| 10,861,503 B1 | 12/2020 | Kim et al. | |
| 11,094,377 B2 | 8/2021 | Redaelli et al. | |
| 11,200,950 B2 | 12/2021 | Redaelli et al. | |
| 2010/0213431 A1 | 8/2010 | Yeh et al. | |
| 2021/0035633 A1* | 2/2021 | Chiang | H10N 70/884 |
| 2022/0415968 A1* | 12/2022 | Lee | H10N 70/026 |

FOREIGN PATENT DOCUMENTS

KR 10-1436324 B1 8/2014

* cited by examiner

*Primary Examiner* — Allison Bernstein
(74) *Attorney, Agent, or Firm* — Muir Patent Law, PLLC

(57) ABSTRACT

A self-selecting memory device includes a first conductive line on a substrate, a first memory cell on the first conductive line, a second conductive line on the first memory cell, a second memory cell on the second conductive line, and a third conductive line on the second memory cell. The first memory cell includes a first electrode, a first switching memory unit and a second electrode sequentially and vertically stacked. The second memory cell includes a third electrode, a second switching memory unit and a fourth electrode sequentially and vertically stacked. The first switching memory unit includes a first SSM pattern contacting an upper surface of the first electrode and including an OTS material, and a first nitrogen-containing pattern contacting an upper surface of the first SSM pattern and a lower surface of the second electrode and including an OTS material doped with nitrogen.

20 Claims, 12 Drawing Sheets

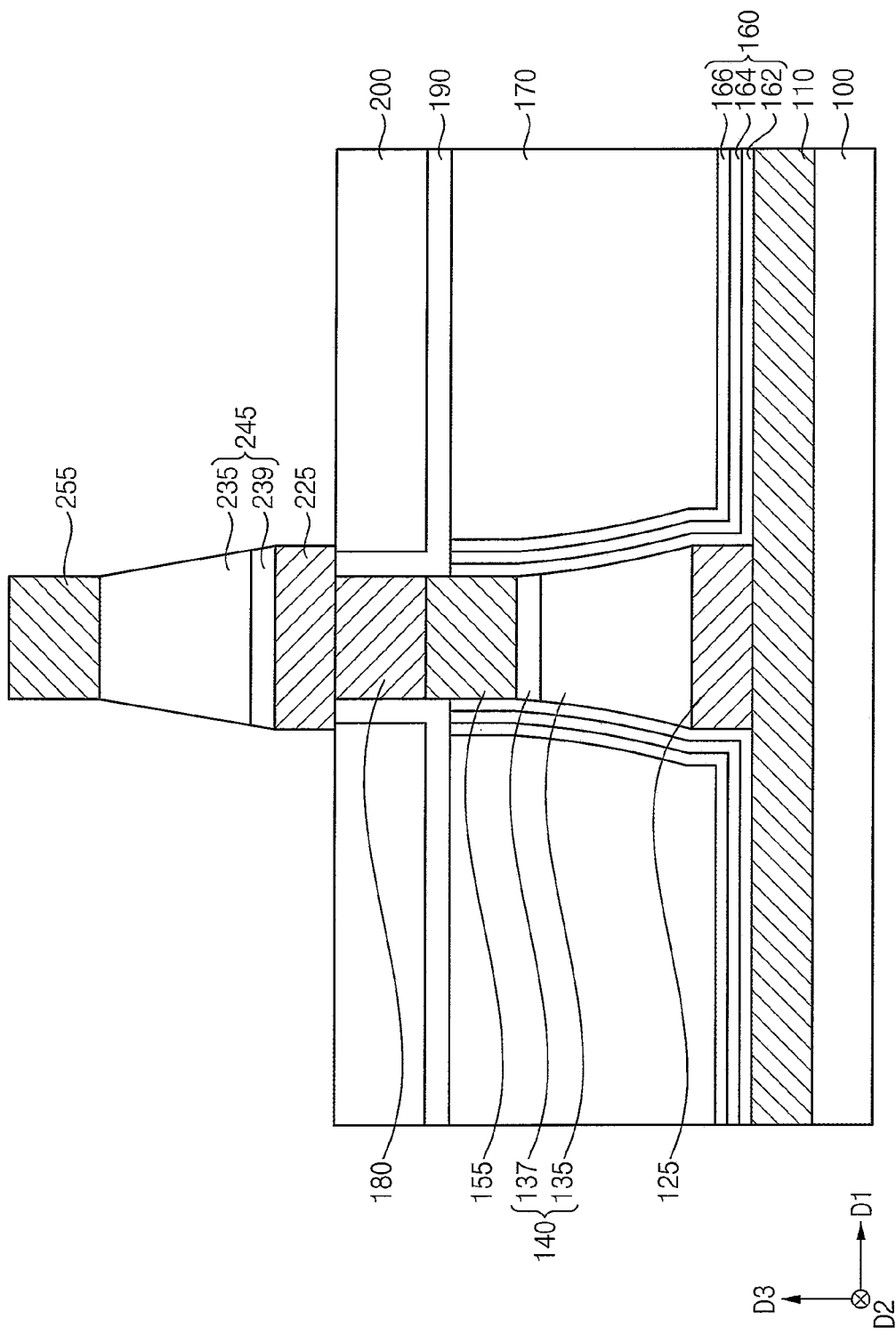

SELF-SELECTING MEMORY DEVICES

CROSS-REFERENCE TO RELATED APPLICATION

This application claims priority under 35 USC § 119 to Korean Patent Application No. 10-2022-0064060, filed on May 25, 2022, in the Korean Intellectual Property Office (KIPO), the contents of which are herein incorporated by reference in their entirety.

1. Field

Example embodiments relate to a self-selecting memory device.

2. Description of the Related Art

Ovonic threshold switch (OTS) material including chalcogenide material may have data storage characteristics and switching characteristics as well, and thus a self-selecting memory device including a switching memory unit that is formed by combining a switching element and a memory element has been developed. Ions included in the OTS material may move according to voltage applied to the switching memory unit, so that ion gradient may be formed in the switching memory unit. Accordingly, switching operation and data storage operation may be performed, and precise control of the operations is important.

SUMMARY

According to example embodiments, there is provided a self-selecting memory device. The self-selecting memory device may include a first conductive line on a substrate, a first memory cell on the first conductive line, a second conductive line on the first memory cell, a second memory cell on the second conductive line, and a third conductive line on the second memory cell. The first memory cell may include a first electrode, a first switching memory unit and a second electrode sequentially stacked in a vertical direction substantially perpendicular to an upper surface of the substrate. The second memory cell may include a third electrode, a second switching memory unit and a fourth electrode sequentially stacked in the vertical direction. The first switching memory unit may include a first SSM pattern contacting an upper surface of the first electrode and including an OTS material, and a first nitrogen-containing pattern contacting an upper surface of the first SSM pattern and a lower surface of the second electrode and including an OTS material doped with nitrogen.

According to example embodiments, there is provided a self-selecting memory device. The self-selecting memory device may include a first conductive line on a substrate and extending in a first direction substantially parallel to an upper surface of the substrate, a second conductive line over the first conductive line and extending in a second direction substantially parallel to the upper surface of the substrate and crossing the first direction, and a memory cell at an area where the first and second conductive lines overlap in a third direction substantially perpendicular to the upper surface of the substrate, the memory cell contacting the first and second conductive lines. The memory cell may include a first electrode contacting an upper surface of the first conductive line, a switching memory unit contacting an upper surface of the first electrode, and a second electrode contacting an upper surface of the switching memory unit. An area of a lower surface of the switching memory unit may be greater than an area of an upper surface of the switching memory unit. The switching memory unit may include an SSM pattern contacting an upper surface of the first electrode and including an OTS material, and a nitrogen-containing pattern contacting an upper surface of the SSM pattern and a lower surface of the second electrode and including an OTS material doped with nitrogen.

According to example embodiments, there is provided a self-selecting memory device. The self-selecting memory device may include first conductive lines on a substrate, second conductive lines over the first conductive lines, third conductive lines over the second conductive lines, first memory cells and second memory cells. Each of the first conductive lines may extend in a first direction substantially parallel to an upper surface of the substrate, and the first conductive lines may be spaced apart from each other in a second direction substantially parallel to the upper surface of the substrate and crossing the first direction. Each of the second conductive lines may extend in the second direction, and the second conductive lines may be spaced apart from each other in the first direction. Each of the third conductive lines may extend in the first direction, and the third conductive lines may be spaced apart from each other in the second direction. The first memory cells may be formed at respective areas where the first and second conductive lines overlap in a third direction substantially perpendicular to the upper surface of the substrate, and each of the first memory cells may contact the first and second conductive lines. The second memory cells may be formed at respective areas where the second and third conductive lines overlap in the third direction, and each of the second memory cells may contact the second and third conductive lines. Each of the first memory cells may include a first electrode, a first switching memory unit and a second electrode sequentially stacked in the third direction. Each of the second memory cells may include a third electrode, a second switching memory unit and a fourth electrode sequentially stacked in the third direction. The first switching memory unit may include a first SSM pattern contacting an upper surface of the first electrode and including an OTS material, and a first nitrogen-containing pattern contacting an upper surface of the first SSM pattern and a lower surface of the second electrode and including an OTS material doped with nitrogen.

BRIEF DESCRIPTION OF THE DRAWINGS

Features will become apparent to those of skill in the art by describing in detail exemplary embodiments with reference to the attached drawings, in which:

FIGS. 11 and 12 are cross-sectional views illustrating stages in a method of manufacturing an SSM device in accordance with example embodiments.

DETAILED DESCRIPTION

It will be understood that, although the terms "first," "second," and/or "third" may be used herein to describe various materials, layers, regions, pads, electrodes, patterns, structure and/or processes, these various materials, layers, regions, pads, electrodes, patterns, structure and/or processes should not be limited by these terms. These terms are only used to distinguish one material, layer, region, pad, electrode, pattern, structure or process from another material, layer, region, pad, electrode, pattern, structure or process. Thus, "first", "second" and/or "third" may be used selectively or interchangeably for each material, layer, region, electrode, pad, pattern, structure or process, respectively.

Hereinafter, in the specifications, two directions substantially parallel to an upper surface of a substrate may be referred to as first and second directions D1 and D2, respectively, and a direction substantially perpendicular to the upper surface of the substrate may be referred to as a third direction D3. In example embodiments, the first and second directions D1 and D2 may be substantially perpendicular to each other.

Figure 1:
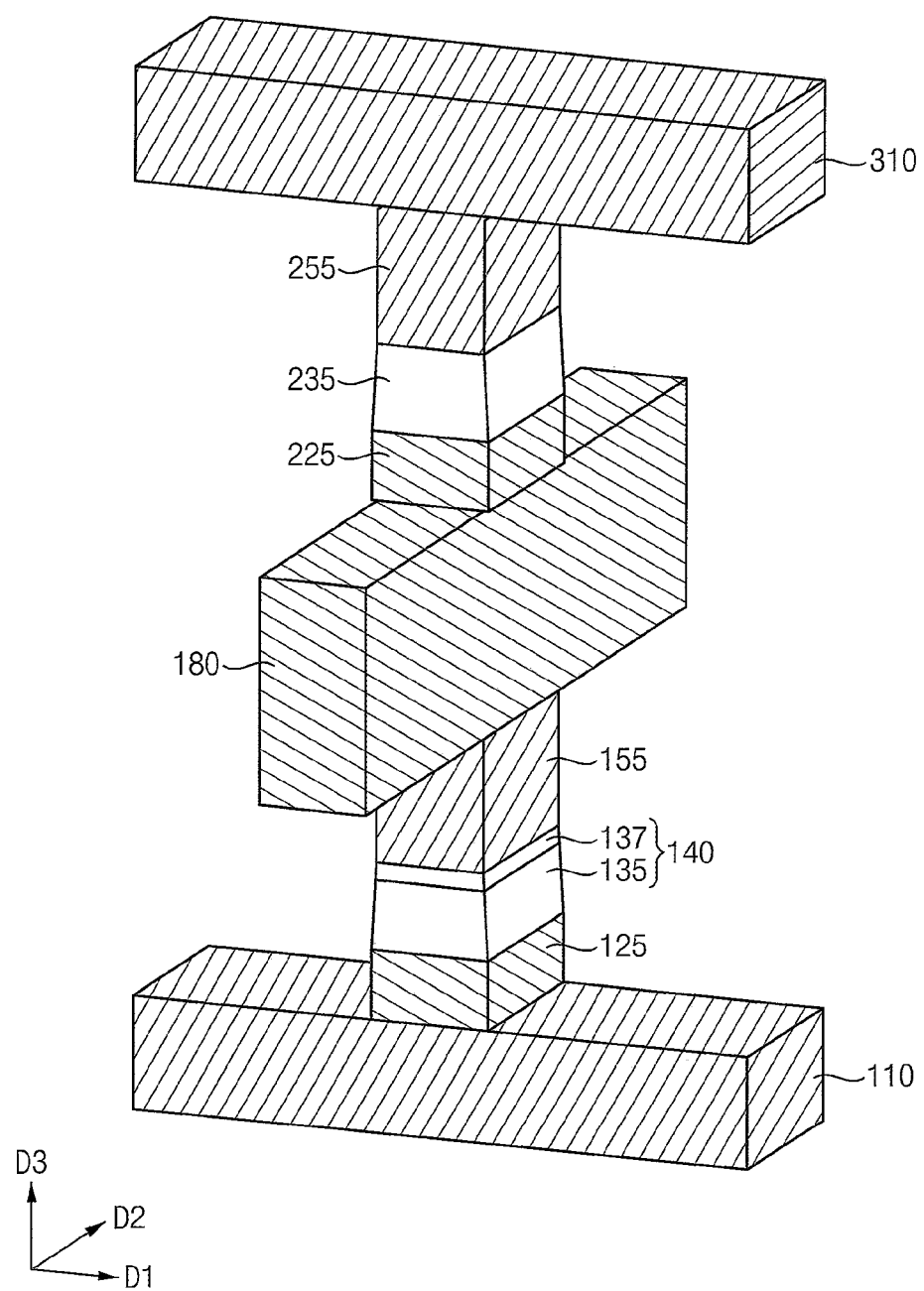
FIGS. 1 and 2 are a perspective view and a cross-sectional view, respectively, illustrating a self-selecting memory (SSM) device in accordance with example embodiments.
Figure 2:
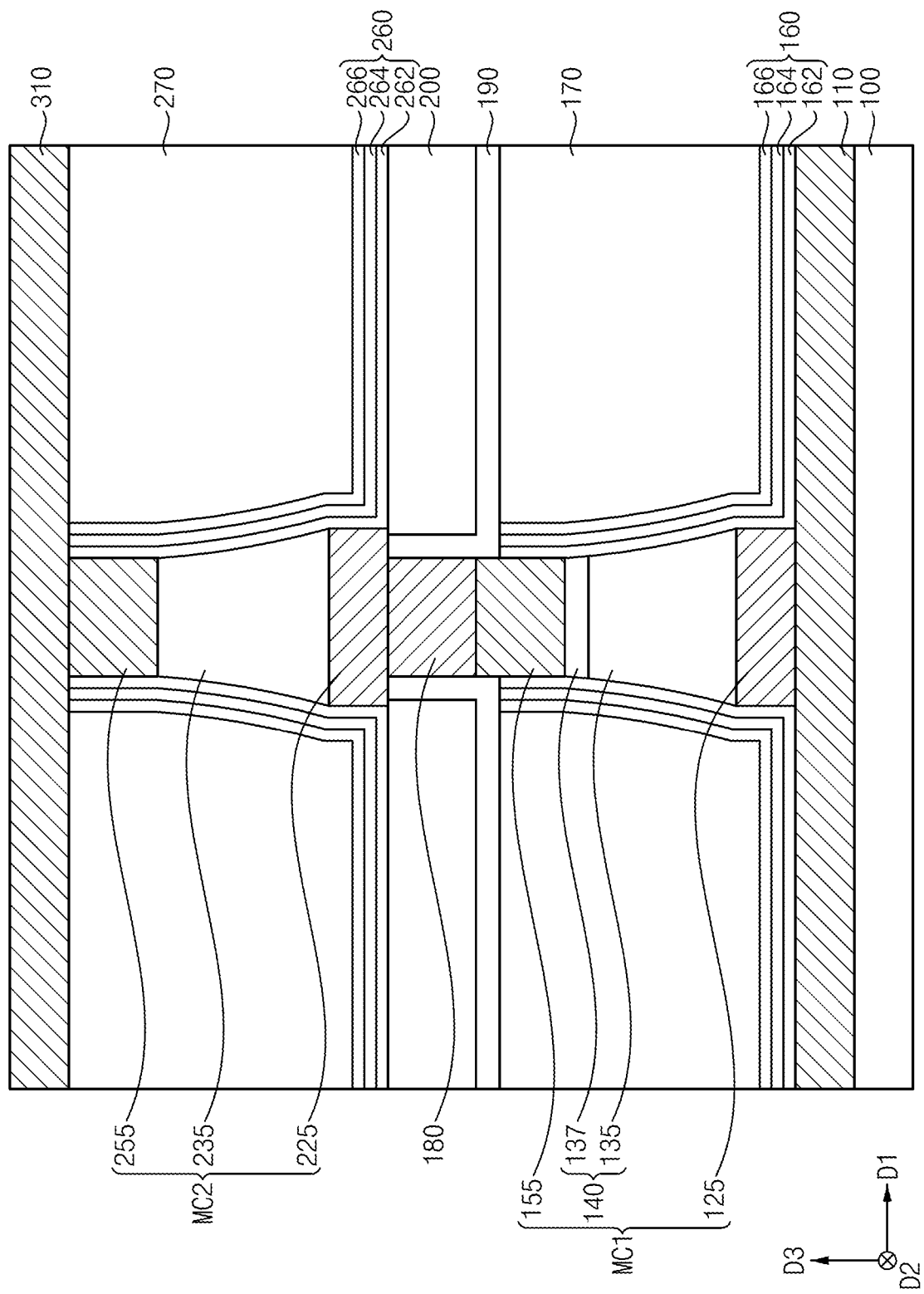

FIGS. 1 and 2 are a perspective view and a cross-sectional view, respectively, illustrating a self-selecting memory (SSM) device in accordance with example embodiments. For clarity of illustration, the substrate and the insulating interlayers are omitted in FIG. 1.

Referring to FIGS. 1 and 2, the SSM device may include first, second, and third conductive lines 110, 180 and 310, and first and second memory cells MC1 and MC2 on a substrate 100. The SSM device may further include a first insulating interlayer, second, third and fourth insulating interlayers 170, 200 and 270, first and third protection layer structures 160 and 260, and a second protection layer structure.

For example, the substrate 100 may include a semiconductor material, e.g., silicon, germanium, or silicon-germanium, or III-V compounds, e.g., GaP, GaAs, GaSb, etc. In an example embodiment, the substrate 100 may be a silicon-on-insulator (SOI) substrate or a germanium-on-insulator (GOI) substrate.

The first conductive line 110 may extend in the first direction D1 through the first insulating interlayer on the substrate 100, and a plurality of first conductive lines 110 may be spaced apart from each other in the second direction D2. The second conductive line 180 may extend in the second direction D2 over the first conductive line 110, and a plurality of second conductive lines 180 may be spaced apart from each other in the first direction D1. The third conductive line 310 may extend in the first direction D1 over the second conductive line 180, and a plurality of third conductive lines 310 may be spaced apart from each other in the second direction D2. Each of the first to third conductive lines 110, 180 and 310 may include, e.g., a metal, a metal nitride, a metal silicon nitride, a metal silicide, doped polysilicon, etc.

For example, each of the first and third conductive lines 110 and 310 may serve as a word line of the SSM device, and the second conductive line 180 may serve as a bit line of the SSM device. Thus, the second conductive line 180 may commonly serve as a bit line of the first and second memory cells MC1 and MC2 under and over, respectively, the second conductive line 180. In another example, each of the first and third conductive lines 110 and 310 may serve as a bit line of the SSM device, and the second conductive line 180 may serve as a word line of the SSM device.

The first insulating interlayer may be formed on the substrate 100, and may contain the first conductive line 110. That is, the first conductive line 110 may extend through the first insulating interlayer, and the first insulating interlayer may cover a sidewall of the first conductive line 110.

The first memory cell MC1 may be formed at an area where the first and second conductive lines 110 and 180 overlap each other in the third direction D3. As the plurality of first conductive lines 110 are spaced apart from each other in the second direction D2 and the plurality of second conductive lines 180 are spaced apart from each other in the first direction D1, a plurality of areas where the first and second conductive lines 110 and 180 overlap each other in the third direction D3 may be spaced apart from each other in the first and second directions D1 and D2. Thus, a plurality of first memory cells MC1 may be spaced apart from each other in the first and second directions D1 and D2, and the SSM device including the plurality of first memory cells may have a cross-point array structure.

In example embodiments, each of the first memory cells MC1 may contact an upper surface of a corresponding one of the first conductive lines 110 and a lower surface of a corresponding one of the second conductive lines 180. In example embodiments, the first memory cell MC1 may have a shape of a circle, ellipse, polygon, polysilicon with rounded corners, etc., in a plan view.

In example embodiments, the first memory cell MC1 may include a first electrode 125, a first switching memory unit 140, and a second electrode 155 sequentially stacked in the third direction D3. The first switching memory unit 140 may include a first SSM pattern 135 and a first nitrogen-containing pattern 137 stacked in the third direction D3.

Each of the first and second electrodes 125 and 155 may include, e.g., a metal, a metal nitride, a metal silicon nitride, a metal silicide, doped polysilicon, etc. For example, as illustrated in FIGS. 1 and 2, the first electrode 125 may, e.g., directly, contact the first conductive line 110, and the second electrode 155 may, e.g., directly, contact the second conductive line 180.

The first SSM pattern 135 may be between the first electrode 125 and the first nitrogen-containing pattern 137. The first SSM pattern 135 may serve as a switching element using resistance difference according to the difference of voltages applied thereto, and may include an OTS material that may store data according to the resistance difference. In example embodiments, the OTS material may include selenium (Se), germanium (Ge) and/or arsenic (As), and may further include silicon (Si), tellurium (Te), sulfur (S), carbon (C), indium (In) or boron (B).

The first nitrogen-containing pattern 137 may be between the second electrode 155 and the first SSM pattern 135. The first nitrogen-containing pattern 137 may include an OTS material doped with nitrogen, and may include selenium nitride. The selenium nitride may include, e.g., $Se_4N_2$, $SeN_2$, $SeN_3$, $SeN_4$, $SeN_5$, $SeN$, $Se_3N_2$, $Se_2N$, etc. The first nitrogen-containing pattern 137 may further include germanium nitride ($Ge_3N_4$) or arsenic nitride (AsN).

In example embodiments, the first switching memory unit 140 may have an area gradually decreasing from a bottom toward a top thereof. For example, a width in the first direction D1 of the first switching memory unit 140 may gradually decrease from the first conductive line 110 to the second conductive line 180.

The first protection layer structure 160 may be formed on the first insulating interlayer and the first conductive line 110, and may, e.g., continuously, cover the, e.g., entire, sidewall of the first memory cell MC1. The second insulating interlayer 170 may be formed on the first protection layer structure 160, e.g., upper surfaces of the first protection layer structure 160 and the second insulating interlayer 170 may be coplanar with each other.

In example embodiments, the first protection layer structure 160 may include first, second, and third protection patterns 162, 164 and 166 sequentially stacked. The first and third protection patterns 162 and 166 may include an insulating nitride, e.g., silicon nitride, and the second protection pattern 164 may include an oxide, e.g., silicon oxide.

The second protection layer structure 190 may be formed on the second insulating interlayer 170 and the first protection layer structure 160, and may cover a sidewall of the second conductive line 180. For example, as illustrated in FIG. 2, both the first and second protection layer structures 160 and 190 may directly contact the sidewall of the second electrode 155. In an example embodiment, the second protection layer structure 190 may be a single layer or a multi-layer. The second protection layer structure 190 may include an insulating nitride, e.g., silicon nitride.

The third insulating interlayer 200 may be formed on the second protection layer structure 190. For example, as illustrated in FIG. 2, uppermost surfaces of the third insulating interlayer 200, the second protection layer structure 190, and the second conductive line 180 may be coplanar with each other.

The second memory cell MC2 may be formed at an area where the second and third conductive lines 180 and 310 overlap each other in the third direction D3. As the plurality of second conductive lines 180 are spaced apart from each other in the first direction D1, and the plurality of third conductive lines 310 are spaced apart from each other in the second direction D2, a plurality of areas where the second and third conductive lines 180 and 310 overlap each other in the third direction D3 may be spaced apart from each other in the first and second directions D1 and D2. Thus, a plurality of second memory cells MC2 may be spaced apart from each other in the first and second directions D1 and D2, and the SSM device including the plurality of second memory cells MC2 may have a cross-point array structure.

In example embodiments, each of the second memory cells MC2 may contact an upper surface of a corresponding one of the second conductive lines 180 and a lower surface of a corresponding one of the third conductive lines 310. In example embodiments, the second memory cell MC2 may have a shape of a circle, ellipse, polygon, polysilicon with rounded corners, etc., in a plan view.

In example embodiments, the second memory cell MC2 may include a third electrode 225, a second switching memory unit, and a fourth electrode 255 sequentially stacked in the third direction D3. The second switching memory unit may include a second SSM pattern 235. Each of the third and fourth electrodes 225 and 255 may include, e.g., a metal, a metal nitride, a metal silicon nitride, a metal silicide, doped polysilicon, etc.

The second SSM pattern 235 may serve as a switching element using resistance difference according to the difference of voltages applied thereto, and may include an OTS material that may store data according to the resistance difference. In example embodiments, the OTS material may include selenium (Se), germanium (Ge), and/or arsenic (As), and may further include silicon (Si), tellurium (Te), sulfur (S), carbon (C), indium (In) or boron (B). In example embodiments, the second SSM pattern 235 may have an area gradually decreasing from a bottom toward a top thereof, e.g., a width in the first direction D1 of the second SSM pattern 235 may gradually decrease from the second conductive line 180 toward the third conductive line 310.

The third protection layer structure 260 may be formed on the third insulating interlayer 200, the second conductive line 180, and the second protection layer structure 190, and may, e.g., continuously, cover a sidewall of the second memory cell MC2. The fourth insulating interlayer 270 may be formed on the third protection layer structure 230.

In example embodiments, the third protection layer structure 260 may include fifth, sixth and seventh protection patterns 262, 264 and 266 sequentially stacked. The fifth and seventh protection patterns 262 and 266 may include an insulating nitride, e.g., silicon nitride, and the sixth protection pattern 264 may include an oxide, e.g., silicon oxide.

The first insulating interlayer and the second to fourth insulating interlayers 170, 200 and 270 may include an oxide, e.g., silicon oxide.

As illustrated above, the first switching memory unit 140 included in the first memory cell MC1 between the first and second conductive lines 110 and 180 may have an area gradually decreasing from a bottom toward a top thereof, and thus, an area of an upper surface of the first switching memory unit 140 may be less than an area of a lower surface thereof. Likewise, the second switching memory unit, i.e., the second SSM pattern 235 included in the second memory cell MC2 between the second and third conductive lines 180 and 310, may have an area gradually decreasing from a bottom toward a top thereof. Thus, an area of an upper surface of the second switching memory unit may be less than an area of a lower surface thereof. The upper surfaces of the first and second switching memory units are surfaces facing the third conductive line 310, while lower surfaces of the first and second switching memory units are surfaces facing the first conductive line 110.

The area of the upper surface of the first switching memory unit 140 under the second conductive line 180 that may commonly apply voltage to the first and second memory cells MC1 and MC2 may be less than the area of the lower surface of the second switching memory unit over the second conductive line 180. For example, as illustrated in FIG. 2, a width of the lower surface of the second SSM pattern 235 may extend beyond that of the upper surface of the first switching memory unit 140.

The first switching memory unit 140 may have the first SSM pattern 135 including an OTS material, and the first nitrogen-containing pattern 137 including an OTS material doped with nitrogen and contacting an upper surface of the first SSM pattern 135. The second switching memory unit may only have the second SSM pattern 235 including an OTS material.

Current may flow in the third direction D3 through the first switching memory unit 140 and the second switching memory unit, which may include an OTS material, according to voltage commonly applied by the second conductive line 180, while the area of the upper surface of the first switching memory unit 140 and the area of the lower surface of the second switching memory unit, both of which face the second conductive line 180, may be different from each other. Thus, even if the same voltage is applied from the second conductive line 180 to the first switching memory unit 140 and the second switching memory unit, ion density in the first SSM pattern 135 included in the first switching memory unit 140 and the second SSM pattern 235 included in the second switching memory unit may not be equal to each other.

For example, when a negative voltage is applied to each of the first and third conductive lines 110 and 310 and a positive voltage is applied to the second conductive line 180, selenium ions included in the first SSM pattern 135 may move upwardly and selenium ions in the second SSM pattern 235 may move downwardly. However, since the area of the upper surface of the first SSM pattern 135 is less than the area of the lower surface of the second SSM pattern 235, a density of selenium ions in an upper portion of the first SSM pattern 135 may be higher than a density of selenium ions in a lower portion of the second SSM pattern 235.

Generally, a threshold voltage in a switching memory unit including an OTS material may depend on a selenium ion density, and thus the first switching memory unit 140 and the second switching memory unit under and over, respectively, the second conductive line 180 may have different threshold voltages from each other. However, in example embodiments, the first switching memory unit 140 may include the first nitrogen-containing pattern 137 contacting the upper surface of the first SSM pattern 135, and the first nitrogen-containing pattern 137 may include an OTS material doped with nitrogen.

That is, the first nitrogen-containing pattern 137 may include a selenium-nitrogen (Se—N) bond stronger than a selenium-selenium (Se—Se) bond. Thus, movement of selenium ions may be restricted when a voltage is applied thereto. When a negative voltage is applied to the first conductive line 110 and a positive voltage is applied to the second conductive line 180, an amount of selenium ions moving upwardly in the first switching memory unit 140 may be limited by the first nitrogen-containing pattern 137, and thus, a density of selenium ions in the upper portion of the first switching memory unit 140 may decrease.

Accordingly, even though the area of the upper surface of the first switching memory unit 140 is less than the area of the lower surface of the second switching memory unit, when a voltage is applied, the movement of the selenium ions may be restricted by the first nitrogen-containing pattern 137 to decrease so that the density of selenium ions in the upper portion of the first switching memory unit 140 may be similar to the density of selenium ions in the lower portion of the second switching memory unit. Therefore, the difference between the threshold voltages thereof may decrease.

The difference between the threshold voltage of the first memory cell including the first switching memory unit 140 and the threshold voltage of the second memory cell including the second switching memory unit may be controlled by a nitrogen concentration of the first nitrogen-containing pattern 137 included in the first switching memory unit 140. That is, as illustrated below in detail in a method of manufacturing a SSM device, the threshold voltage difference due to the area difference of the upper surface of the first switching memory unit 140 and the lower surface of the second switching memory unit (which may occur during an etching process for forming the first switching memory unit 140 and the second switching memory unit) may decrease by doping nitrogen in an upper portion of the first SSM pattern 135 included in the first switching memory unit 140, and may be precisely controlled by adjusting the concentration of nitrogen doped into the upper portion of the first SSM pattern 135.

FIGS. 1 and 2 show the first and second memory cells MC1 and MC2 disposed at two levels, respectively. However, memory cells may be disposed at more than two levels. If the first and second memory cells MC1 and MC2 are formed under and over, respectively, the second conductive line 180 that may apply voltage, the first switching memory unit 140 included in the first memory cell MC1 may further include the first nitrogen-containing pattern 137 on the first SSM pattern 135.

FIGS. 3 to 9 are cross-sectional views illustrating stages in a method of manufacturing an SSM device in accordance with example embodiments.

Figure 3:
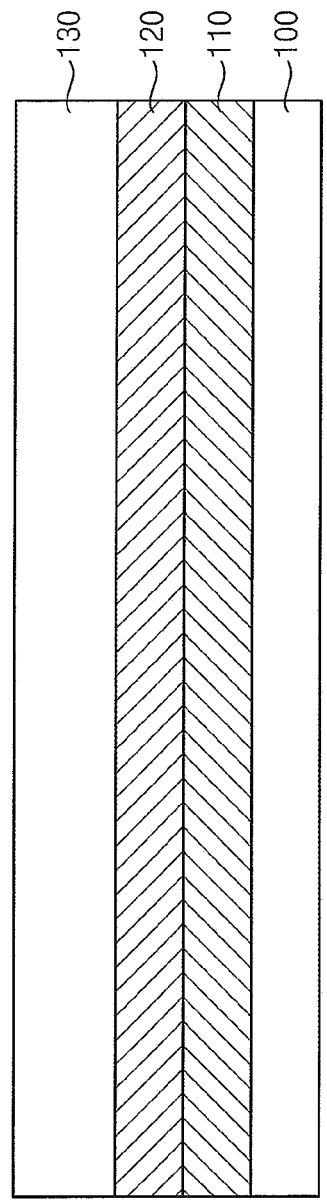
FIGS. 3 to 9 are cross-sectional views illustrating stages in a method of manufacturing an SSM device in accordance with example embodiments.
Figure 3:
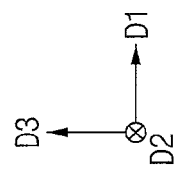

Referring to FIG. 3, a first insulating interlayer containing a first conductive line 110 may be formed on the substrate 100, and a first electrode layer 120 and a first SSM layer 130 may be sequentially formed on the first insulating interlayer and the first conductive line 110.

In an example embodiment, the first conductive line 110 may be formed by forming the first insulating interlayer on the substrate 100, forming a first opening through the first insulating interlayer to expose an upper surface of the substrate 100, forming a first conductive layer on the substrate 100 and the first insulating interlayer to fill the first opening, and planarizing the first conductive layer until an upper surface of the first insulating interlayer is exposed. The planarization process may include a chemical mechanical polishing (CMP) process and/or an etch back process. In example embodiments, the first conductive line 110 may extend in the first direction D1, and a plurality of first conductive lines 110 may be spaced apart from each other in the second direction D2.

The first SSM layer 130 may be formed by a deposition process, e.g., a chemical vapor deposition (CVD) process, an atomic layer deposition (ALD) process, etc. The first SSM layer 130 may include an OTS material containing, e.g., selenium (Se), germanium (Ge) and/or arsenic (As).

Figure 4:
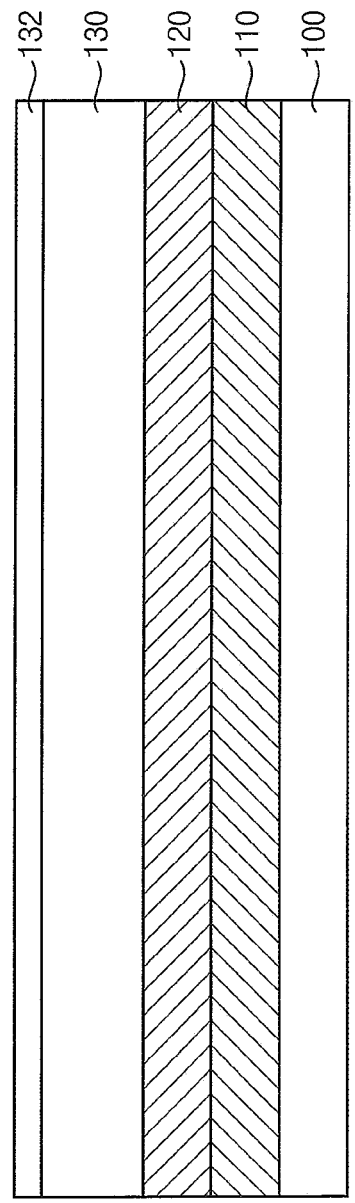
Figure 4:
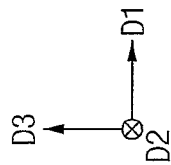

Referring to FIG. 4, a plasma nitridation process may be performed on an upper portion of the first SSM layer 130, which may be transformed into a first nitrogen-containing layer 132. As the plasma nitridation process is performed, nitrogen may be doped into the upper portion of the first SSM layer 130, and selenium included in the upper portion of the first SSM layer 130 and nitrogen may be combined to form selenium nitride.

A concentration of nitrogen doped into the upper portion of the first SSM layer 130 may be changed according to process conditions, e.g., a flow of nitrogen source gas used in the plasma nitridation process, a magnitude of bias, etc. Thus, the doping concentration in the first nitrogen-containing layer 132 may be adjusted.

Additionally, germanium and arsenic included in the first SSM layer 130 may be combined with nitrogen to form germanium nitride and arsenic nitride, respectively. In an example embodiment, the deposition process for forming the first SSM layer 130 and the plasma nitridation process may be performed in-situ.

Figure 5:
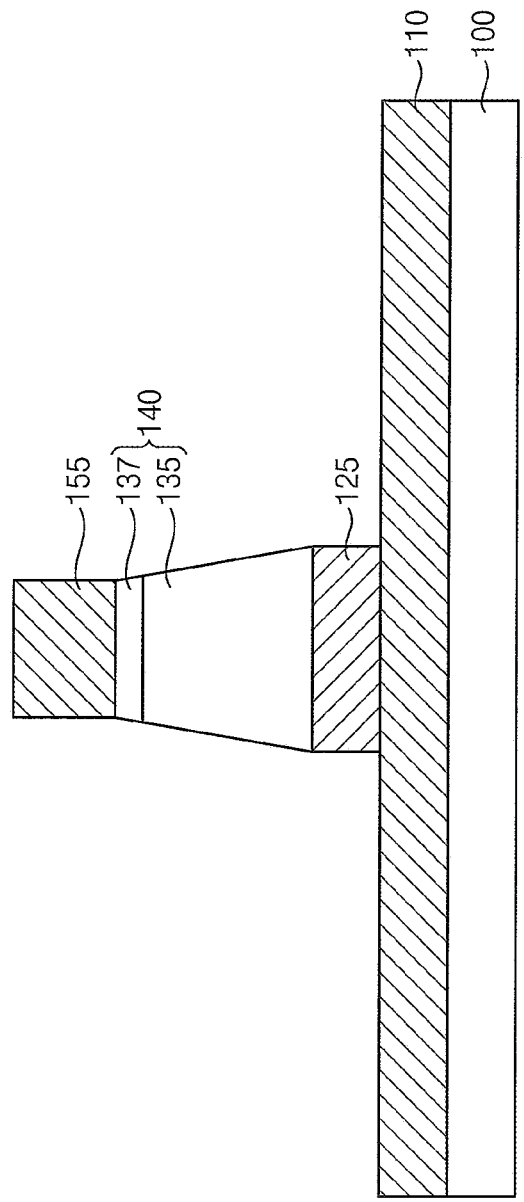

Referring to FIG. 5, a second electrode layer may be formed on the first nitrogen-containing layer 132, an etching mask may be formed on the second electrode layer, and the second electrode layer, the first nitrogen-containing layer 132, the first SSM layer 130, and the first electrode layer 120 may be sequentially patterned by an etching process using the etching mask to form the second electrode 155, the first nitrogen-containing pattern 137, the first SSM pattern 135, and the first electrode 125, respectively.

In example embodiments, the etching process may be performed by a reactive ion etching (ME) process. In an example embodiment, the etching process may include a first etching process using a first etching mask extending in the first direction D1 and a second etching process using a second etching mask extending in the second direction D2. Alternatively, the etching process may be performed using a single etching mask.

The first SSM pattern 135 and the first nitrogen-containing pattern 137 on the first electrode 125 may collectively form the first switching memory unit 140, and the first electrode 125, the first switching memory unit 140, and the second electrode 155 sequentially stacked in the third direction D3 may collectively form the first memory cell.

In example embodiments, a plurality of first memory cells may be spaced apart from each other in the first and second directions D1 and D2. The first memory cells may be spaced apart from each other in the first direction D1 on each of the first conductive lines 110, and the first electrodes 125 included in the first memory cells may contact an upper surface of each of the first conductive lines 110.

In example embodiments, the first switching memory unit 140 may have an area gradually decreasing from a bottom toward a top thereof due to the general characteristics of an etching process.

Figure 6:
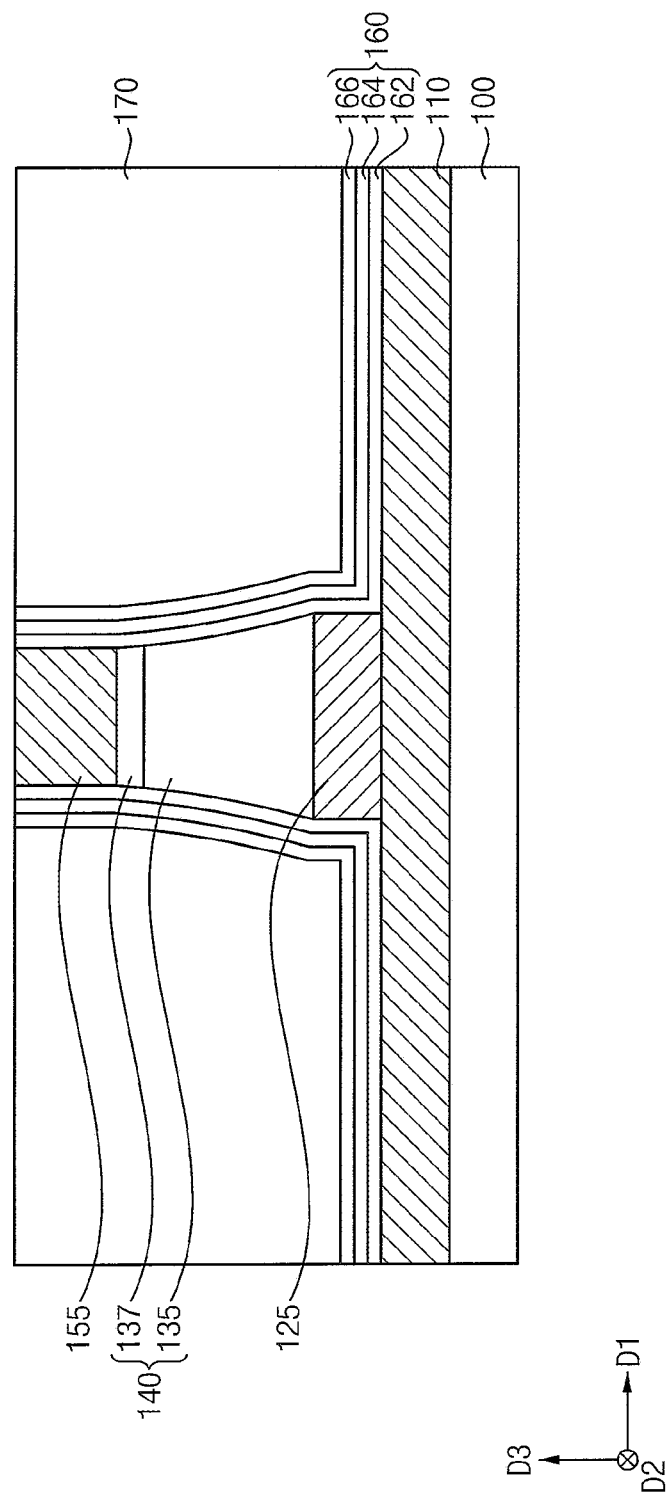

Referring to FIG. 6, a first protection layer structure 160 may be formed on the first conductive line 110 and the first insulating interlayer to cover the first memory cell, the second insulating interlayer 170 may be formed on the first protection layer structure 160, and the second insulating interlayer 170 and the first protection layer structure 160 may be planarized until an upper surface of the second electrode 155 is exposed. Thus, the first protection layer structure 160 may be formed on a sidewall of the first memory cell and upper surfaces of the first conductive line 110 and the first insulating interlayer. In an example embodiment, the first protection layer structure 160 may include the first, second, and third protection patterns 162, 164 and 166 sequentially stacked.

Figure 7:
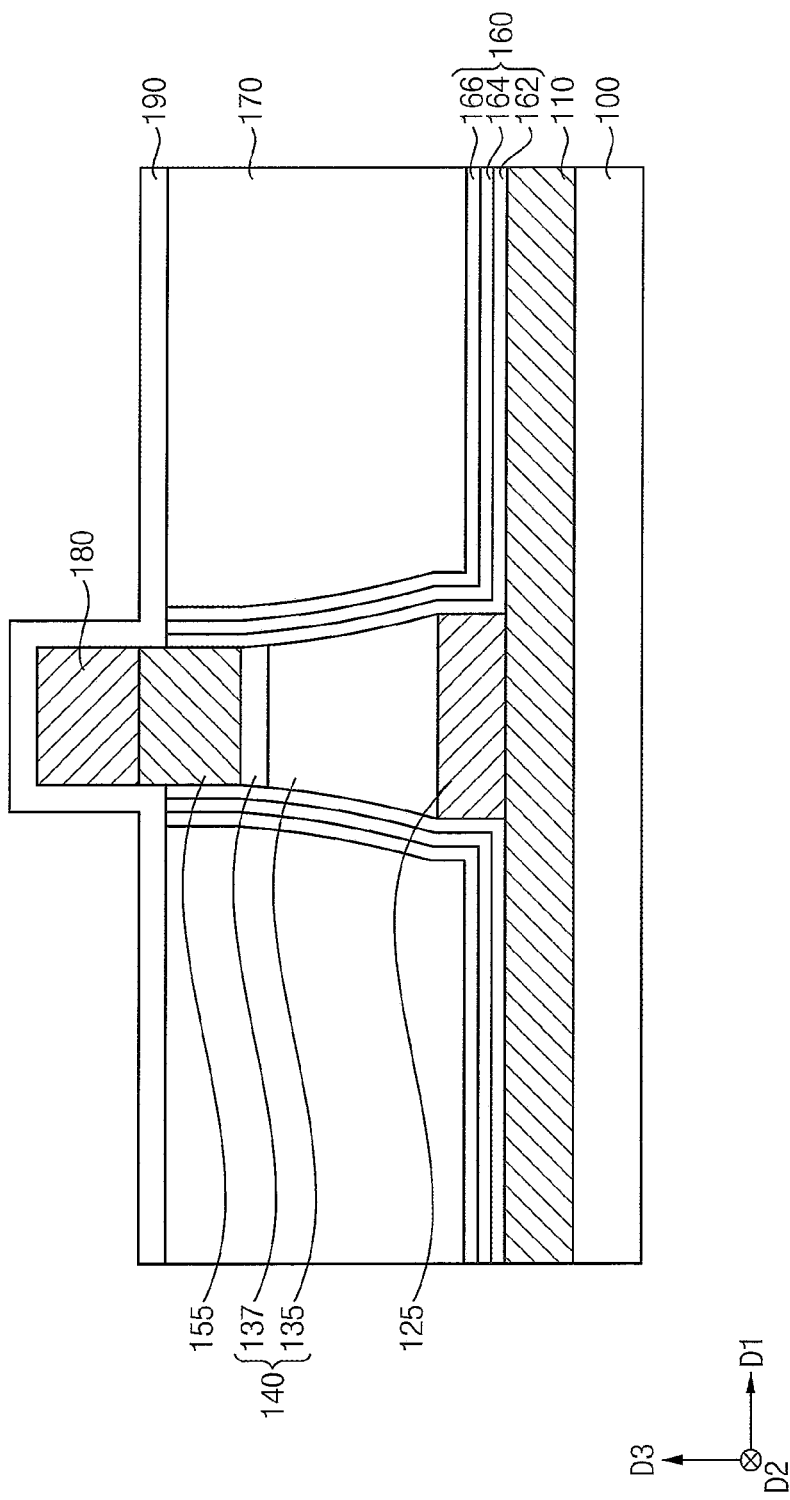

Referring to FIG. 7, a second conductive line 180 may be formed on the second electrode 155, the first protection layer structure 160, and the second insulating interlayer 170, and the second protection layer structure 190 may be formed on the first protection layer structure 160 and the second insulating interlayer 170 to cover the second conductive line 180.

In example embodiments, the second conductive line 180 may extend in the second direction D2, and a plurality of second conductive lines 180 may be spaced apart from each other in the first direction D1. Each of the second conductive lines 180 may be formed on the first memory cells spaced apart from each other in the second direction D2, and may contact upper surfaces of the second electrodes 155 included in the first memory cells.

In an example embodiment, the second protection layer structure 190 may include an insulating nitride, e.g., silicon nitride. The second protection layer structure 190 may be formed conformally on the first protection layer structure 160, the second insulating interlayer 170, and the second conductive line 180.

Figure 8:
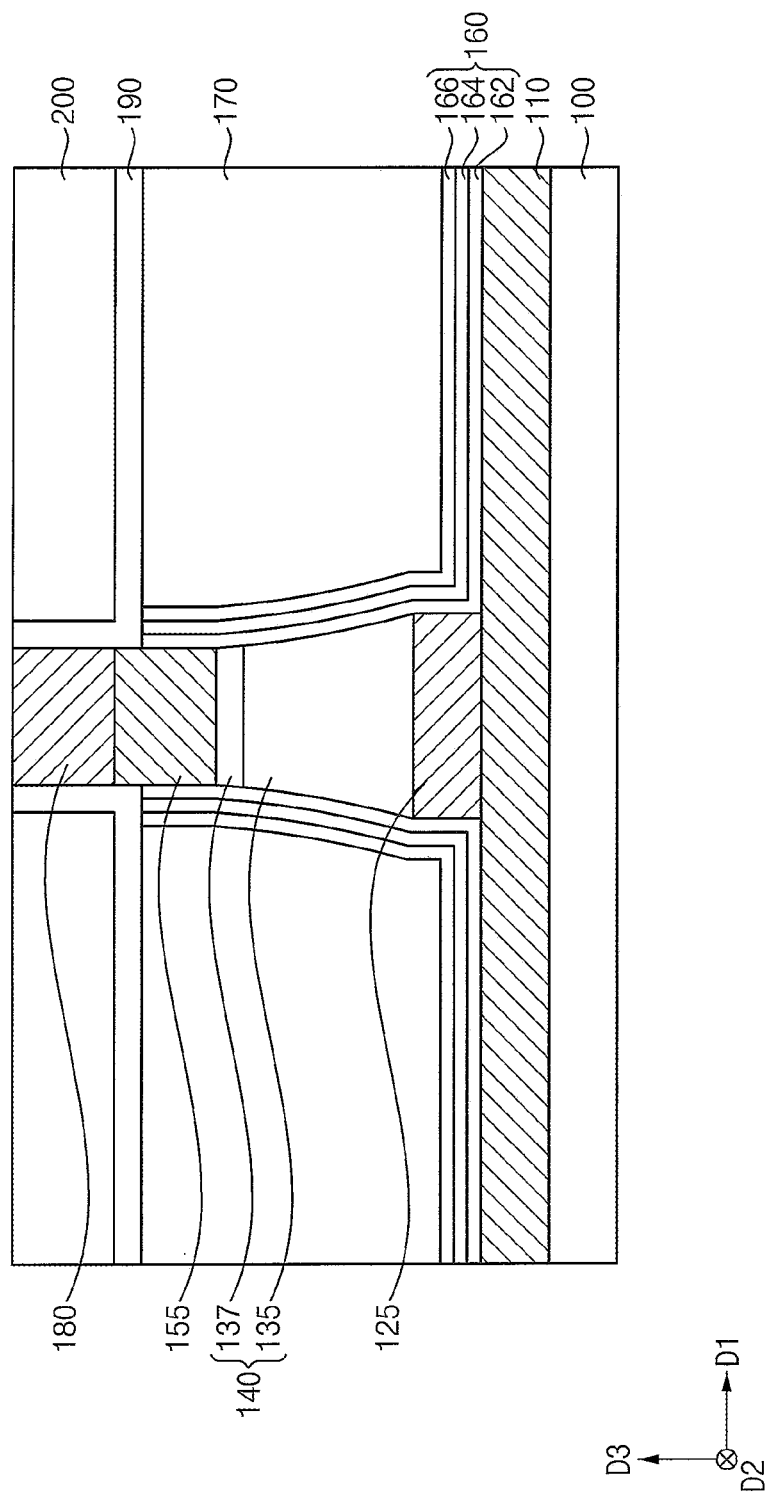

Referring to FIG. 8, the third insulating interlayer 200 may be formed on the second protection layer structure 190, and the third insulating interlayer 200 and the second protection layer structure 190 may be planarized until an upper surface of the second conductive line 180 is exposed. Thus, the second protection layer structure 190 may be formed on a sidewall of the second conductive line 180 and upper surfaces of the second insulating interlayer 170 and the first protection layer structure 160.

Figure 9:
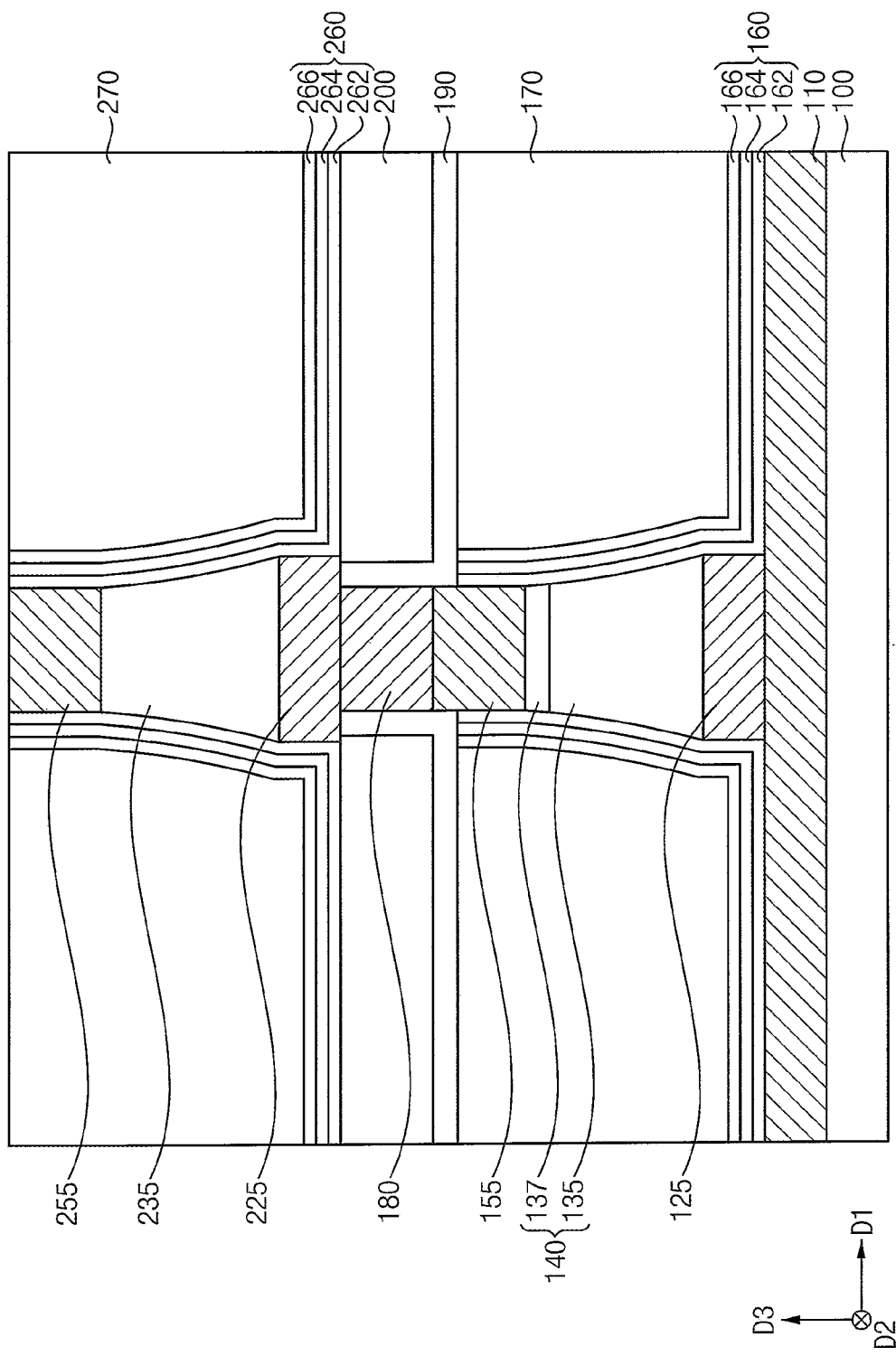

Referring to FIG. 9, processes substantially the same as or similar to those illustrated with reference to FIGS. 3 to 6 may be performed so that the second memory cell, the third protection layer structure 260, and the fourth insulating interlayer 270 may be formed on the second conductive line 180, the second protection layer structure 190, and the third insulating interlayer 200. However, a plasma nitridation process may not be performed.

Thus, the second memory cell may include the third electrode 225, the second switching memory unit, and the fourth electrode 255 sequentially stacked in the third direction D3, and the second switching memory unit may include the second SSM pattern 235. That is, the second switching memory unit may not include a nitrogen-containing pattern, and may include only the second SSM pattern 235.

In example embodiments, a plurality of second memory cells may be spaced apart from each other in the first and second directions D1 and D2. The second memory cells spaced apart from each other in the second direction D2 may be formed on each of the second conductive lines 180, and the third electrodes 225 included in the second memory cells may contact an upper surface of each of the second conductive lines 180. In example embodiments, the second switching memory unit, i.e., the second SSM pattern 235 may have an area gradually decreasing from a bottom toward a top thereof due to the general characteristics of an etching process.

The third protection layer structure 260 may include the fifth, sixth and seventh protection patterns 262, 264 and 266 sequentially stacked in the third direction D3. Referring to FIGS. 1 and 2, the third conductive line 310 may be formed on the fourth electrode 255, the third protection layer structure 260, and the fourth insulating interlayer 270 to complete the fabrication of the SSM device.

In example embodiments, the third conductive line 310 may extend in the first direction D1, and a plurality of third conductive lines 310 may be spaced apart from each other in the second direction D2. The second memory cells spaced apart from each other in the first direction D1 may be formed on each of the third conductive lines 310, and the fourth electrodes 255 included in the first memory cells may contact an upper surface of each of the third conductive lines 310.

As illustrated above, each of the first switching memory unit 140 and the second switching memory unit, which may be formed by an etching process, may have an area gradually decreasing from a bottom toward a top thereof. However, unlike the second switching memory unit, the first switching memory unit 140 may further include the first nitrogen-containing pattern 137, which may be formed by doping nitrogen into the upper portion of the first SSM pattern 135 through a plasma nitridation process.

Figure 10:
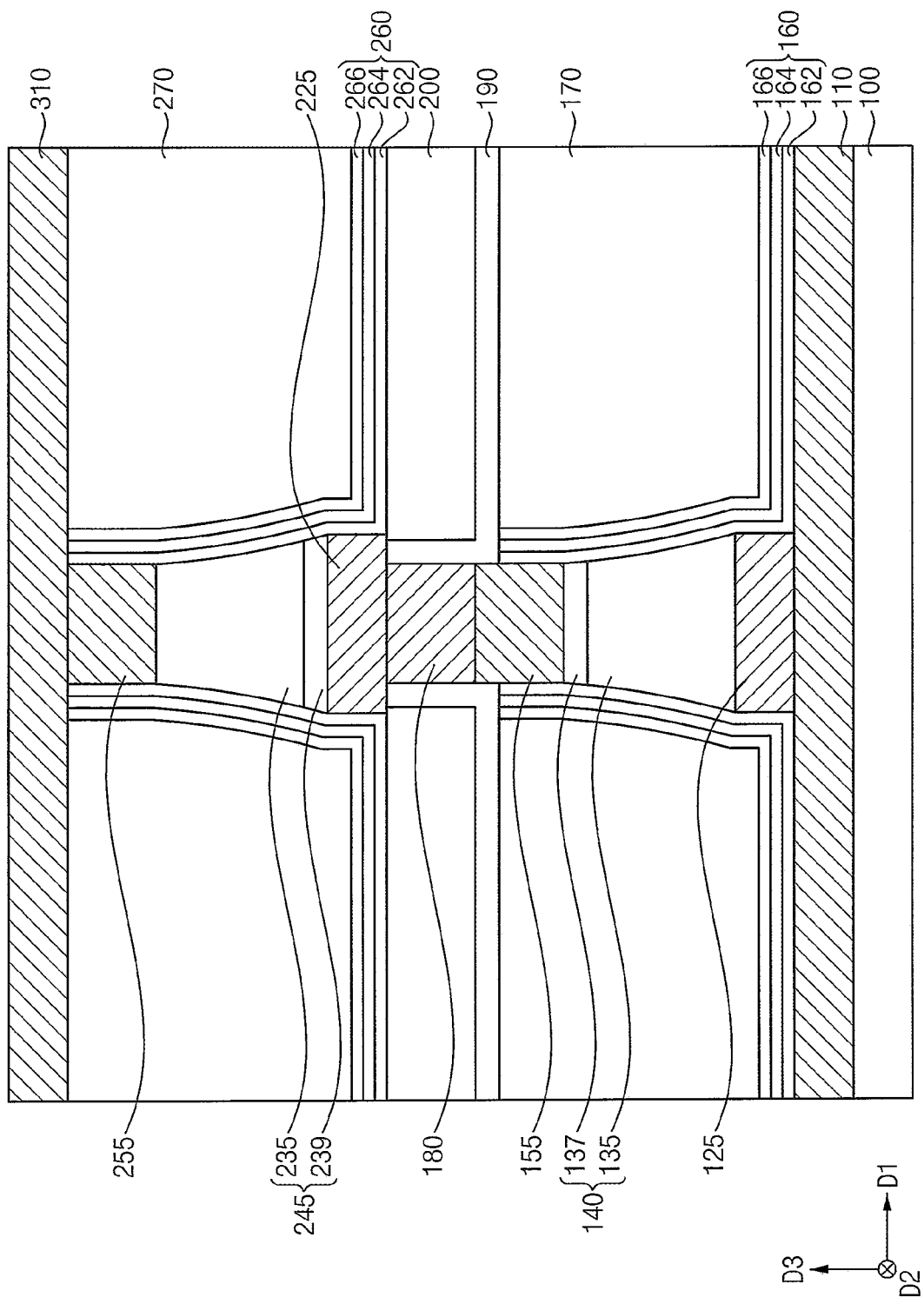
FIG. 10 is a cross-sectional view illustrating an SSM device in accordance with example embodiments.

FIG. 10 is a cross-sectional view illustrating an SSM device in accordance with example embodiments, which may correspond to FIG. 2. The SSM device in FIG. 10 may be substantially the same as or similar to the SSM device of FIGS. 1 and 2, except for including a third switching memory unit instead of the second switching memory unit.

Referring to FIG. 10, the second memory cell between the second and third conductive lines 180 and 310 may include the third electrode 225, a third switching memory unit 245, and the fourth electrode 255 sequentially stacked in the third direction D3, and the third switching memory unit 245 may include a second SSM pattern 235 and a second nitrogen-containing pattern 239 stacked. Unlike the second switching memory unit shown in FIGS. 1 and 2, the third switching memory unit 245 may further include the second nitrogen-containing pattern 239 on the second SSM pattern 235.

The second nitrogen-containing pattern 239 may include an OTS material like the first nitrogen-containing pattern 137. In example embodiments, a concentration of nitrogen included in the second nitrogen-containing pattern 239 may be less than a concentration of nitrogen included in the first nitrogen-containing pattern 137.

That is, the area of the upper surface of the first switching memory unit 140 may be less than an area of a lower surface of the third switching memory unit 245, which may face the second conductive line 180, and thus the first switching memory unit 140 may further include the first nitrogen-containing pattern 137 on the first SSM pattern 135 so that the difference between the threshold voltages of the first and second memory cells may decrease.

The third switching memory unit 245 may further include the second nitrogen-containing pattern 239 contacting a lower surface of the second SSM pattern 235, which may increase the difference between the threshold voltages of the first and second memory cells. However, a concentration of nitrogen doped in the second nitrogen-containing pattern 239 may be less than a concentration of nitrogen doped in the first nitrogen-containing pattern 137, and thus, the concentration of nitrogen doped in the first and second nitrogen-containing patterns 137 and 239 may be controlled to decrease the difference between the threshold voltages of the first and second memory cells.

Figure 11:
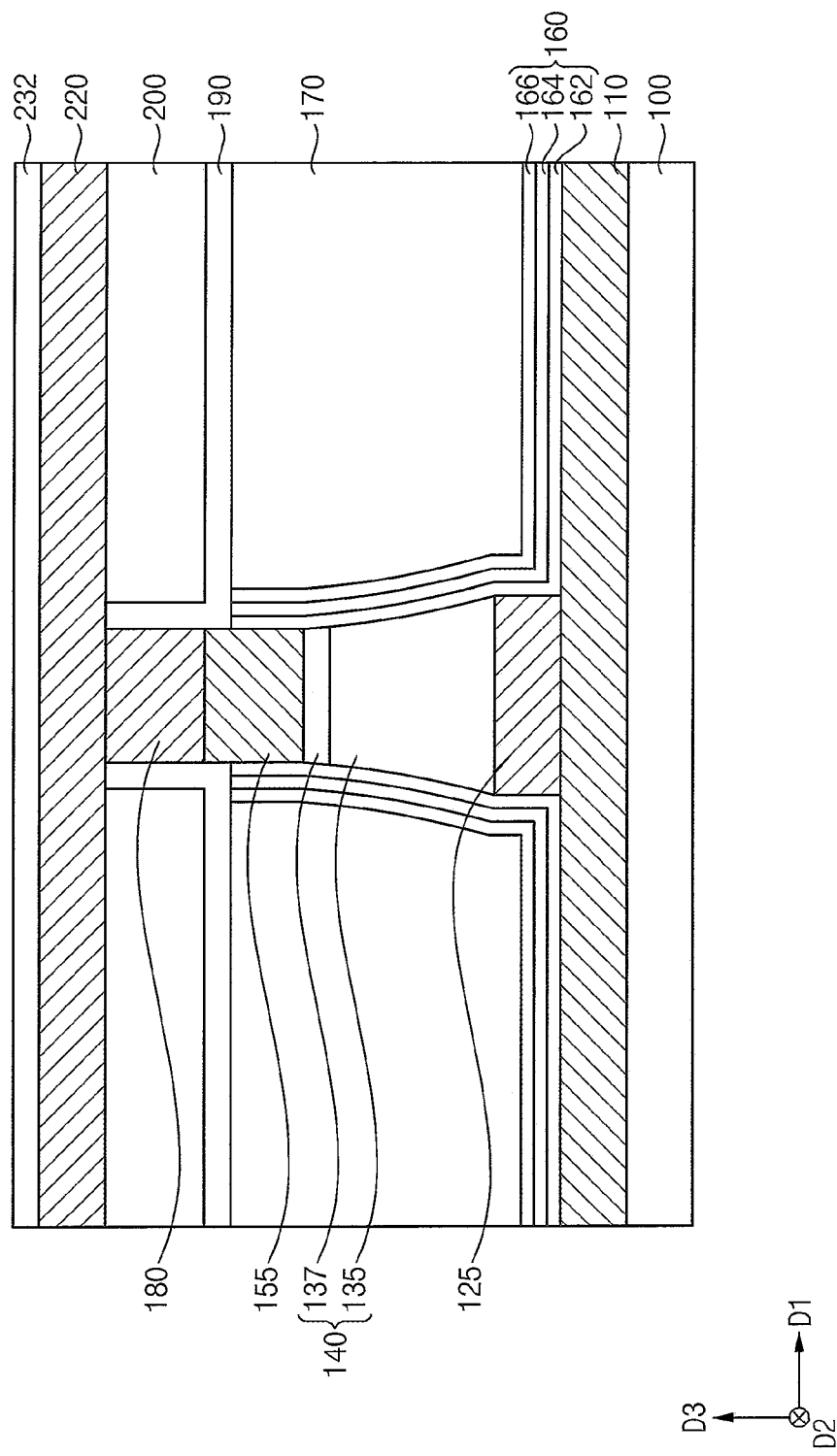

FIGS. 11 and 12 are cross-sectional views illustrating stages in a method of manufacturing an SSM device in accordance with example embodiments. The method in FIGS. 11 and 12 may include processes substantially the same as or similar to those described with reference to FIGS. 3 to 9 and FIGS. 1 and 2, and thus repeated explanations thereof are omitted herein.

Referring to FIG. 11, processes substantially the same as or similar to those illustrated with reference to FIGS. 3 to 8 may be performed, and a third electrode layer 220 may be formed on the second conductive line 180, the second protection layer structure 190 and the third insulating interlayer 200.

A second nitrogen-containing layer 232 may be formed on the third electrode layer 220. In example embodiments, the second nitrogen-containing layer 232 may be formed by forming a third SSM layer on the third electrode layer 220, and doping nitrogen in the third SSM layer through e. g., a plasma nitridation process.

Process conditions, e.g., a flow of a nitrogen source gas used in the plasma nitridation process, may be controlled to adjust a concentration of nitrogen doped into the third SSM layer. In example embodiments, a nitrogen concentration in the second nitrogen-containing layer 232 may be less than a nitrogen concentration in the first nitrogen-containing pattern 137.

Referring to FIG. 12, a second SSM layer and a fourth electrode layer may be sequentially formed on the second nitrogen-containing layer 232, an etching mask may be formed on the fourth electrode layer, and the fourth electrode layer, the second SSM layer, the second nitrogen-containing layer 232, and the third electrode layer 220 may be patterned by an etching process using the etching mask to form the fourth electrode 255, the second SSM pattern 235, the second nitrogen-containing pattern 239, and the third electrode 225, respectively. The second nitrogen-containing pattern 239 and the second SSM pattern 235 stacked on the third electrode 225 may collectively form the third switching memory unit 245, and the third electrode 225, the third switching memory unit 245, and the fourth electrode 255 sequentially stacked in the third direction D3 may collectively form a second memory cell.

Referring to FIG. 10 again, processes substantially the same as or similar to those illustrated with reference to FIG. 9 and FIGS. 1 and 2 may be performed to form the third protection layer structure 260, the third protection layer structure 260, the fourth insulating interlayer 270 and the third conductive line 310, so that the fabrication of the SSM device may be completed.

By way of summation and review, example embodiments provide a self-selecting memory device having improved characteristics. That is, in the self-selecting memory device in accordance with example embodiments, the threshold voltage differences between memory cells stacked in the vertical direction may decrease, and thus, the self-selecting memory device may have enhanced electrical characteristics.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A self-selecting memory (SSM) device, comprising:
a first conductive line on a substrate;
a first memory cell on the first conductive line;
a second conductive line on the first memory cell;
a second memory cell on the second conductive line; and
a third conductive line on the second memory cell,
wherein:
the first memory cell includes a first electrode, a first switching memory unit, and a second electrode sequentially stacked in a vertical direction substantially perpendicular to an upper surface of the substrate,
the second memory cell includes a third electrode, a second switching memory unit, and a fourth electrode sequentially stacked in the vertical direction, and
the first switching memory unit includes:
a first SSM pattern contacting an upper surface of the first electrode, the first SSM pattern including an ovonic threshold switching (OTS) material; and
a first nitrogen-containing pattern contacting an upper surface of the first SSM pattern and a lower surface of the second electrode, the first nitrogen-containing pattern including an (OTS) material doped with nitrogen.

2. The SSM device as claimed in claim 1, wherein the first nitrogen-containing pattern includes selenium nitride.

3. The SSM device as claimed in claim 2, wherein the selenium nitride includes at least one of $Se_4N_2$, $SeN_2$, $SeN_3$, $SeN_4$, $SeN_5$, $SeN$, $Se_3N_2$ and $Se_2N$.

4. The SSM device as claimed in claim 1, wherein the first nitrogen-containing pattern further includes germanium nitride ($Ge_3N_4$) and arsenic nitride (AsN).

5. The SSM device as claimed in claim 1, wherein the first SSM pattern includes selenium, germanium and arsenic.

6. The SSM device as claimed in claim 1, wherein the second switching memory unit includes a second SSM pattern contacting an upper surface of the third electrode and a lower surface of the fourth electrode, the second SSM pattern including an OTS material.

7. The SSM device as claimed in claim 6, wherein an area of a lower surface of the second SSM pattern is greater than an area of an upper surface of the first nitrogen-containing pattern.

8. The SSM device as claimed in claim 1, wherein the second switching memory unit includes:
a second nitrogen-containing pattern contacting an upper surface of the third electrode, the second nitrogen-containing pattern including an OTS material doped with nitrogen; and
a second SSM pattern contacting an upper surface of the second nitrogen-containing pattern and a lower surface of the fourth electrode, the second SSM pattern including an OTS material.

9. The SSM device as claimed in claim 8, wherein a concentration of nitrogen doped in the first nitrogen-containing pattern is higher than a concentration of nitrogen doped in the second nitrogen-containing pattern.

10. The SSM device as claimed in claim 1, wherein each of the first conductive line and the third conductive line extends in a first direction substantially parallel to the upper surface of the substrate, and the second conductive line extends in a second direction substantially parallel to the upper surface of the substrate and crossing the first direction.

11. The SSM device as claimed in claim 1, wherein each of the first conductive line and the third conductive line serves as a bit line, and the second conductive line serves as a word line.

12. A self-selecting memory (SSM) device, comprising:
a first conductive line on a substrate, the first conductive line extending in a first direction substantially parallel to an upper surface of the substrate;
a second conductive line over the first conductive line, the second conductive line extending in a second direction substantially parallel to the upper surface of the substrate and crossing the first direction; and
a memory cell at an area where the first conductive line and the second conductive line overlap in a third direction substantially perpendicular to the upper surface of the substrate, the memory cell contacting the first conductive line and the second conductive line,
wherein:
the memory cell includes:
a first electrode contacting an upper surface of the first conductive line;
a switching memory unit contacting an upper surface of the first electrode; and
a second electrode contacting an upper surface of the switching memory unit,
an area of a lower surface of the switching memory unit is greater than an area of an upper surface of the switching memory unit, and
the switching memory unit includes:
an SSM pattern contacting the upper surface of the first electrode, the SSM pattern including an ovonic threshold switching (OTS) material; and
a nitrogen-containing pattern contacting an upper surface of the SSM pattern and a lower surface of the second electrode, the nitrogen-containing pattern including an OTS material doped with nitrogen.

13. The SSM device as claimed in claim 12, wherein the nitrogen-containing pattern includes selenium nitride.

14. The SSM device as claimed in claim 12, wherein the SSM pattern includes selenium, germanium and arsenic.

15. The SSM device as claimed in claim 12, wherein:
the first conductive line is one of a plurality of first conductive lines spaced apart from each other in the second direction, and the second conductive line is one of a plurality of second conductive lines spaced apart from each other in the first direction, and the memory cell is one of a plurality of memory cells spaced apart from each other in the first and second directions.

16. A self-selecting memory (SSM) device, comprising:
first conductive lines on a substrate, each of the first conductive lines extending in a first direction substantially parallel to an upper surface of the substrate, and the first conductive lines being spaced apart from each other in a second direction substantially parallel to the upper surface of the substrate and crossing the first direction;
second conductive lines over the first conductive lines, each of the second conductive lines extending in the second direction, and the second conductive lines being spaced apart from each other in the first direction;
third conductive lines over the second conductive lines, each of the third conductive lines extending in the first direction, and the third conductive lines being spaced apart from each other in the second direction;
first memory cells at respective areas where the first conductive lines and the second conductive lines overlap in a third direction substantially perpendicular to the upper surface of the substrate, each of the first memory cells contacting a respective first conductive line and a respective second conductive line; and
second memory cells at respective areas where the second conductive line and the third conductive lines overlap in the third direction, each of the second memory cells contacting a respective second conductive line and a respective third conductive line,
wherein:
each of the first memory cells includes a first electrode, a first switching memory unit and a second electrode sequentially stacked in the third direction,
each of the second memory cells includes a third electrode, a second switching memory unit and a fourth electrode sequentially stacked in the third direction, and
the first switching memory unit includes:
a first SSM pattern contacting an upper surface of the first electrode, the first SSM pattern including an ovonic threshold switching (OTS) material; and
a first nitrogen-containing pattern contacting an upper surface of the first SSM pattern and a lower surface of the second electrode, the first nitrogen-containing pattern including an OTS material doped with nitrogen.

17. The SSM device as claimed in claim 16, wherein the first nitrogen-containing pattern includes selenium nitride.

18. The SSM device as claimed in claim 16, wherein the first SSM pattern includes selenium, germanium and arsenic.

19. The SSM device as claimed in claim 16, wherein:
the second switching memory unit includes a second SSM pattern contacting an upper surface of the third electrode and a lower surface of the fourth electrode, the second SSM pattern including an OTS material, and
an area of a lower surface of the second SSM pattern is greater than an area of an upper surface of the first nitrogen-containing pattern.

20. The SSM device as claimed in claim 16, wherein the second switching memory unit includes:
a second nitrogen-containing pattern contacting an upper surface of the third electrode, the second nitrogen-containing pattern including an OTS material doped with nitrogen; and a second SSM pattern contacting an upper surface of the second nitrogen-containing pattern and a lower surface of the fourth electrode, the second SSM pattern including an OTS material,
wherein a concentration of nitrogen doped in the first nitrogen-containing pattern is higher than a concentration of nitrogen doped in the second nitrogen-containing pattern.

* * * * *